(12) United States Patent
Mattmann et al.

(10) Patent No.: US 10,791,630 B2
(45) Date of Patent: Sep. 29, 2020

(54) PRINTED CIRCUIT BOARD AND SENSOR

(71) Applicant: CONTINENTAL AUTOMOTIVE GmbH, Hannover (DE)

(72) Inventors: Erich Mattmann, Heidesheim (DE); Robert Peter, Sulzbach (DE); Waldemar Brinkis, Nidderau (DE); Martin Maasz, Sulzbach (DE); Burkhard Dasbach, Frankfurt (DE)

(73) Assignee: Vitesco Technologies GmbH, Hannover (DE)

( * ) Notice: Subject to any disclaimer, the term of this patent is extended or adjusted under 35 U.S.C. 154(b) by 0 days.

(21) Appl. No.: 16/322,408

(22) PCT Filed: Jul. 12, 2017

(86) PCT No.: PCT/EP2017/067490
§ 371 (c)(1),
(2) Date: Jan. 31, 2019

(87) PCT Pub. No.: WO2018/024451
PCT Pub. Date: Feb. 8, 2018

(65) Prior Publication Data
US 2019/0200456 A1 Jun. 27, 2019

(30) Foreign Application Priority Data

Aug. 2, 2016 (DE) .......................... 10 2016 214 277

(51) Int. Cl.
*H05K 5/00* (2006.01)
*H05K 1/16* (2006.01)
(Continued)

(52) U.S. Cl.
CPC ........... *H05K 1/16* (2013.01); *G01F 23/0007* (2013.01); *G01F 23/363* (2013.01); *H01C 10/32* (2013.01);
(Continued)

(58) Field of Classification Search
CPC .. H05K 5/0047; H05K 5/0026; H05K 5/0043; H05K 5/0052; H01L 2924/1632;
(Continued)

(56) References Cited

U.S. PATENT DOCUMENTS 5,587,882 A * 12/1996 Patel ................... H01L 23/3675
257/713
7,388,284 B1 * 6/2008 Zhang ..................... H01L 23/10
257/704
(Continued)

FOREIGN PATENT DOCUMENTS

DE   10 2007 061 316     6/2009
EP      0 844 459         5/1998
(Continued)

OTHER PUBLICATIONS

Office Action dated Jan. 20, 2020 issued in Korean Patent Application No. 10-2019-7004501.

*Primary Examiner* — Jeremy C Norris
(74) *Attorney, Agent, or Firm* — Cozen O'Connor

(57) ABSTRACT

A printed circuit board having conductor tracks formed on one side of a substrate. The substrate is able to be cohesively bonded at a contact face to a cover for protecting the conductor tracks. In this case, the substrate includes a step, which forms a barrier with respect to an auxiliary material for promoting the cohesive bond, in order to prevent any wetting of the conductor tracks with the auxiliary material. A sensor having a printed circuit board for use in a fuel filling level measurement system of a vehicle.

20 Claims, 2 Drawing Sheets

(51) Int. Cl.
*H05K 1/03* (2006.01)
*H05K 1/09* (2006.01)
*G01F 23/36* (2006.01)
*H05K 3/34* (2006.01)
*H05K 1/11* (2006.01)
*H01C 10/32* (2006.01)
*G01F 23/00* (2006.01)
*H01C 10/08* (2006.01)
*H05K 3/12* (2006.01)

(52) U.S. Cl.
CPC ........... *H05K 1/0306* (2013.01); *H05K 1/092* (2013.01); *H05K 1/111* (2013.01); *H05K 3/341* (2013.01); *H05K 5/0043* (2013.01); *H01C 10/08* (2013.01); *H05K 3/1216* (2013.01); *H05K 3/1283* (2013.01); *H05K 2201/09845* (2013.01); *H05K 2201/10151* (2013.01); *H05K 2201/10371* (2013.01); *Y02P 70/611* (2015.11); *Y02P 70/613* (2015.11)

(58) Field of Classification Search
CPC ..... H01L 2924/16315; H01L 2924/163; H01L 2924/1631
USPC ........................................................ 257/704
See application file for complete search history.

(56) References Cited

U.S. PATENT DOCUMENTS

| | | | |
|---|---|---|---|
| 2004/0196137 A1 | 10/2004 | Dedert | |
| 2011/0174533 A1 | 7/2011 | Nagano | |
| 2016/0307874 A1* | 10/2016 | Oggioni | ............... H01L 25/0657 |
| 2017/0062297 A1* | 3/2017 | Tran | ................... H01L 23/10 |
| 2018/0158794 A1* | 6/2018 | Ishida | .................... H01L 24/48 |

FOREIGN PATENT DOCUMENTS

| | | |
|---|---|---|
| EP | 2 187 435 | 5/2010 |
| JP | 2011-066651 | 3/2011 |

* cited by examiner

PRINTED CIRCUIT BOARD AND SENSOR

CROSS REFERENCE TO RELATED APPLICATIONS

This is a U.S. national stage of application No. PCT/EP2017/067490, filed on Jul. 12, 2017. Priority is claimed on German Application No. DE102016214277.1, filed Aug. 2, 2016, the content of which is incorporated herein by reference.

BACKGROUND OF THE INVENTION

1. Field of the Invention

The present invention relates to a printed circuit board and to a sensor having such a printed circuit board.

2. Description of the Prior Art

According to the prior art, magnetic passive position sensors are known, which are employed in a fuel tank of a motor vehicle in order to sense the fuel filling level. Sensors of this type are also referred to as MAPPS (MAgnetic Passive Position Sensor). A sensor of this type contains a printed circuit board, which, on one side of a substrate, is populated with conductor tracks and a contact spring structure, wherein the contact spring structure is brought into contact with the conductor tracks by a magnet depending on the fuel filling level of the tank.

The conductor tracks and the contact spring structure have a very fine structure and therefore need to be protected from contamination and corrosion. For this reason, that side of the substrate that is populated with the conductor tracks and the contact spring structure is encapsulated so as to be liquid-tight or hermetically sealed. Therefore, such a sensor is not dependent on the fuel composition and is thus equally suitable for all fuel types. In addition, such a sensor represents what is referred to as a closed system. By contrast, conventional open systems that do not have such a contact spring structure are protected from corrosion by special alloys, in order that they can be used in an aggressive medium such as gasoline or diesel. In this case, the alloys are coordinated with the fuels of the particular region and the sulfur, ethanol or methanol content thereof.

Such a sensor or MAPPS is known for example from the patent EP 0 844 459 B1, which is hereby incorporated by reference and made part of the disclosure of this application.

In order to encapsulate the MAPPS in a hermetically sealed manner, the printed circuit board is cohesively bonded to a cover plate or cover for example by soldering. During soldering a flux should be added as auxiliary material for the cohesive bond, said flux allowing better wetting of the contact or connecting face of the printed circuit board or substrate of the printed circuit board with a soldering agent. However, the use of such an auxiliary material can lead to undesired wetting of other faces of the printed circuit board side to be encapsulated than said contact or connecting face, wherein this undesired wetting can impair the contacting of the conductor tracks with the contact spring structure.

SUMMARY OF THE INVENTION

It is an object of one aspect of the present invention to prevent such impairments.

A printed circuit board is proposed, having conductor tracks formed on one side of a substrate, wherein the substrate is able to be cohesively bonded at a contact or connecting face to a cover for protecting the conductor tracks or for protecting the populated substrate side.

In this case—as in the case of the MAPPS—the cohesive bond can be configured such that it ensures hermetic sealing off of the populated substrate side, such that this side is absolutely free of contamination and corrosion.

Here, the substrate has a step, which forms a barrier with respect to an auxiliary material for promoting the cohesive bond, in order to prevent any wetting of the conductor tracks or of the populated substrate side with the auxiliary material.

This stops the undesired wetting, mentioned at the beginning, of other faces of the populated substrate side that are not intended to be wetted.

A step within the meaning of this application is a variation in a substrate thickness, which can be increased and/or decreased by the variation. In other words, the step can accordingly be embodied in a substrate-reinforcing and/or substrate-weakening manner. A positive step increases the substrate thickness, whereas a negative step decreases the substrate thickness.

An auxiliary material within the meaning of this application is a material added to the cohesive bond by a bonding material, said material allowing better wetting of the contact or connecting face of the printed circuit board or of the substrate of the printed circuit board with the bonding material for the cohesive bond between the printed circuit board and the cover or a cover plate. The bonding material can in this case be a filler material, for instance a solder, filler metal, or adhesive. In principle, however, a cohesive bond can also be brought about without such a filler material, in that the faces to be bonded together fuse together. In this case, at least one of the materials of the faces represents the bonding material.

For example, a flux is such an auxiliary material.

A flux is an auxiliary material, added during soldering, within the meaning of this application, which brings about better wetting of a surface or contact face of the substrate, to be bonded, with a solder as bonding material. It removes oxides present on the surface by chemical reaction. The same goes for oxides that arise during a soldering operation as a result of the oxygen in the air.

Such a solder bond represents only one possibility for the cohesive bond. In addition or as an alternative thereto, the cohesive bond between the substrate and the cover can also be brought about by adhesive bonding and/or welding. In a corresponding manner, a bonding material can also be an adhesive and/or a filler metal.

According to one embodiment, with regard to the substrate, the step is arranged on the inside with respect to the contact face of the substrate. This prevents the above-described undesired wetting of other faces of the populated substrate side that are not intended to be wetted.

According to a further embodiment, the step is formed in a substrate-reinforcing manner, i.e., the step increases the substrate thickness as a positive step.

According to a further embodiment, the step comprises the contact face of the substrate. In other words, the contact face transitions directly into the step. Or, put another way, the step directly adjoins the contact face. This allows a very space-saving configuration of the printed circuit board. In principle, however, it is also conceivable to space apart the step from the contact face or layer.

The step can in this case be formed in a one-layer or multilayer manner. In this case, identical or different materials can be used for the layers.

According to one embodiment, the step comprises a first layer, a second layer and a third layer, wherein the first and second layer form the contact layer and the third layer forms the barrier.

The step can in this case contain metal. As a result, the step is suitable for soldering with a metal or at least metalized contact face of the cover.

According to one embodiment, the step is formed from a silver-containing sintering paste. In principle, the sintering paste can be any conceivable, preferably metal-containing sintering paste, which is suitable for producing such a step.

Such a sintering paste, which can have been printed for instance on a substrate made of alumina ceramic, is compacted and solidified during drying and sintering in a sintering furnace to form a solid material.

Sintering is understood here to mean solidification and compaction of a sintering paste to form a compact material as a result of a temperature treatment in a sintering furnace.

According to a further embodiment, the step is formed in a manner encircling the conductor tracks. In this case, the step can be formed in a continuously encircling manner, such that—if necessary, as for instance in the case of the MAPPS—hermetic sealing of the populated substrate side to be covered can be achieved.

Depending on how the substrate side to be covered is intended to be embodied, the step can be formed along the edges of the substrate. This allows a very space-saving configuration of the printed circuit board.

The substrate can in this case be formed from a sintered ceramic. In principle, the substrate can be produced from any conceivable material, which is suitable for a printed circuit board, for instance in conjunction with the MAPPS.

Also proposed is a sensor having a cover, said sensor having a printed circuit board of the above-described type.

Also proposed is a fuel filling level measurement system having a sensor of the above-described type.

Furthermore, a vehicle is proposed, having a fuel filling level measurement system of the above-described type.

BRIEF DESCRIPTION OF THE DRAWINGS

The invention will be explained in detail in the following text with reference to the illustrations in the figures. Further advantageous developments of the invention can be gathered from the dependent claims and the following description of preferred embodiments. In the drawings:

DETAILED DESCRIPTION OF THE PRESENTLY PREFERRED EMBODIMENTS

Identical features or features having an identical effect are denoted by the same reference signs throughout the figures.

Figure 1:
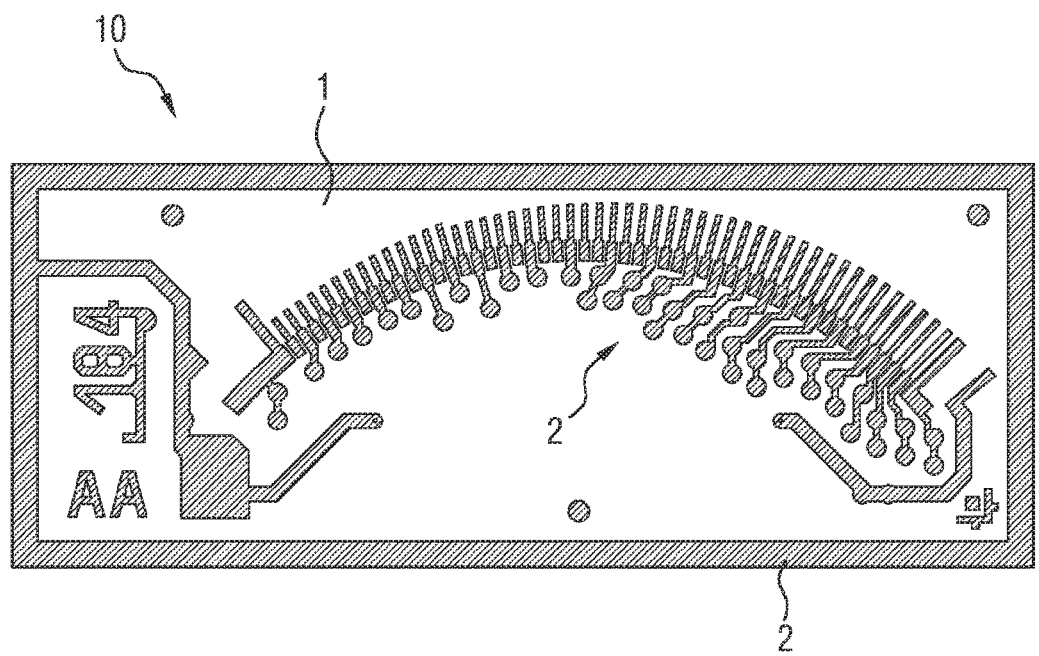
FIG. 1 is a printed circuit board according to the prior art.

FIG. 1 illustrates a printed circuit board 10, known from the prior art, of a MAPPS (MAgnetic Passive Position Sensor). The printed circuit board 10 comprises a substrate 1, which is formed from an alumina sintered ceramic. The substrate 1 is printed on one side with conductor tracks 2, which may have been applied by the stencil printing or screen printing method. In addition, the substrate 1 has, along its edges, a continuously encircling contact face 2 or layer, which surrounds the conductor tracks 2. Both the conductor tracks 2 and the contact face 2 or layer are in this case formed from a metal-containing sintering paste. This is expediently the same material, for instance a silver-containing sintering paste. The thickness of these layers is also expediently identical. The contact face 2 or layer is able to be cohesively bonded to a corresponding metal or at least metalized cover, such that the printed substrate side can be hermetically sealed and consequently remains free of contamination and corrosion.

Figure 2:
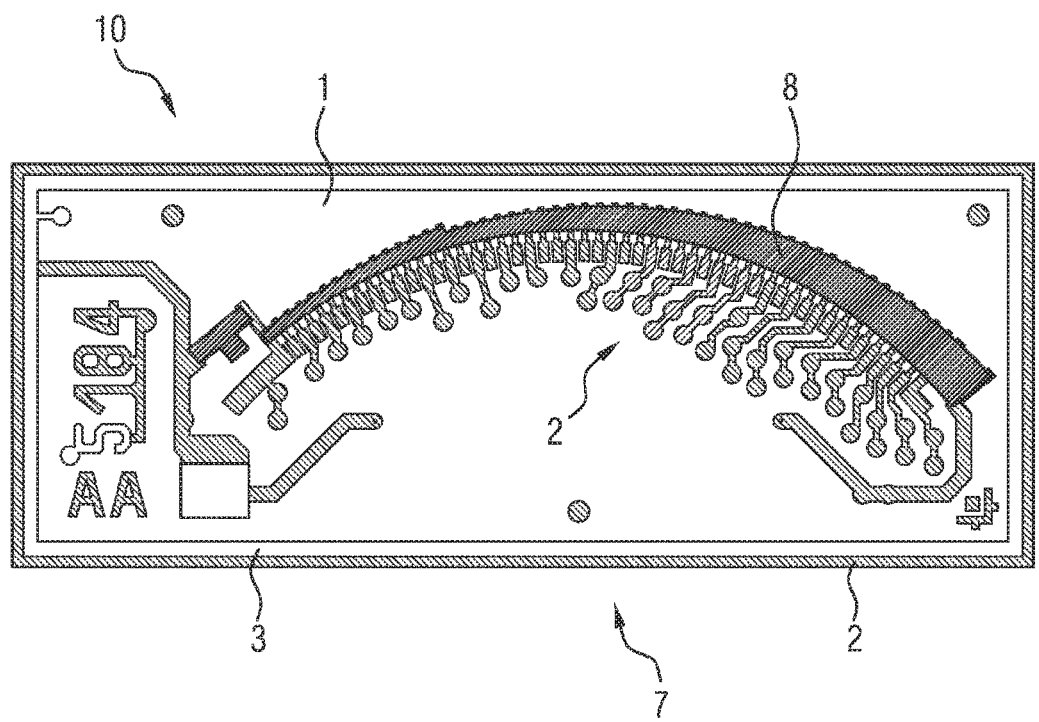
FIG. 2 is a printed circuit board according to the invention.

FIG. 2 illustrates a further developed printed circuit board 10, in which both conductor tracks 2 made of the metal-containing sintering paste and a resistance track 8 or layer—which is not illustrated as such in FIG. 1—have been printed on that side of the substrate 1 that is to be covered. Both the conductor tracks 2 and the resistance track 8 have been applied by the stencil printing or screen printing method.

Analogously to FIG. 1, the conductor tracks 2 and the resistance track 8 are surrounded by the continuously encircling contact face 2 or layer, which has been printed on along the edges of the substrate 1, in order to ensure a hermetic seal with a correspondingly bondable cover. This contact face 2 consists here of the same sintering paste as is also used for the conductor tracks 2. This contact face 2 is furthermore adjoined by a step 3 which, with regard to the substrate 1, is arranged on the inside with respect to the contact face 2 and which is formed, analogously to the contact face 2, in a continuously encircling manner such that it surrounds the conductor tracks 2 and the resistance track 8.

The step 3 acts here as a barrier with respect to a flux with which the contact face 2 is wetted, in order to promote the cohesive bond between the contact face 2 and a corresponding contact face of the cover by a solder.

Figure 3:
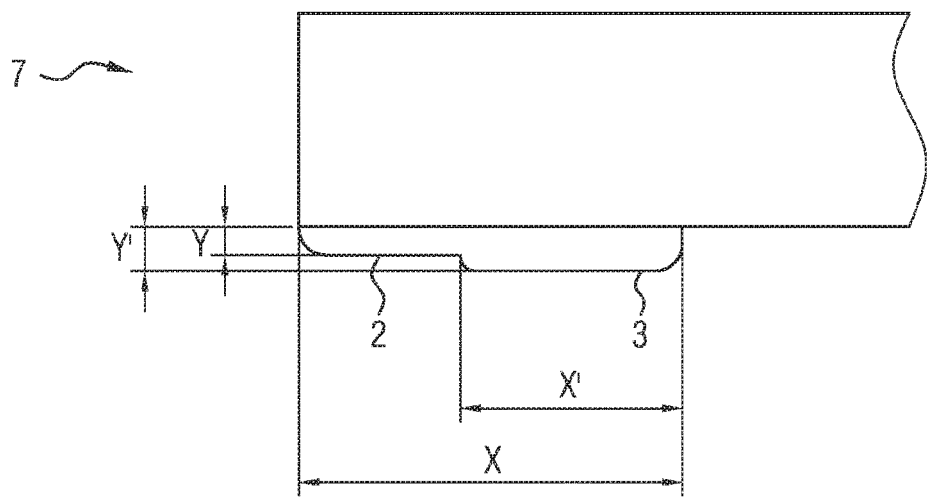
FIG. 3 is a possible step configuration.

FIG. 3 illustrates the peripheral region 7 of the substrate 1 shown in FIG. 2 in a cross-sectional illustration. Specifically, one possible embodiment of the step 3 can be seen. The step 3 in this case comprises the contact face 2 or layer of the sintering paste, i.e., the contact face transitions directly into the step. Or, put another way, the step directly adjoins the contact face, such that the substrate thickness is increased or enhanced.

Starting from the edge of the substrate 1, the thickness of the sintering paste changes from Y to Y' by way of a substantially positive step or flank jump. The width of the sintering paste corresponds to X and the width of the step corresponds to X'. In this example, Y=0.015 mm, Y'=0.025 mm and X=1.2 mm, X'=0.7 mm.

The sintering paste, including the contact face portion and the step, is in this case formed in one layer. To this end, the sintering paste is printed onto the ceramic substrate by a corresponding stencil or by a corresponding screen. The stencil or screen is in this case formed in a correspondingly finely woven manner, such that it allows such a stepped imprint on the substrate. Alternatively, the sintering paste can also be applied in layers (cf. FIG. 4).

Figure 4:
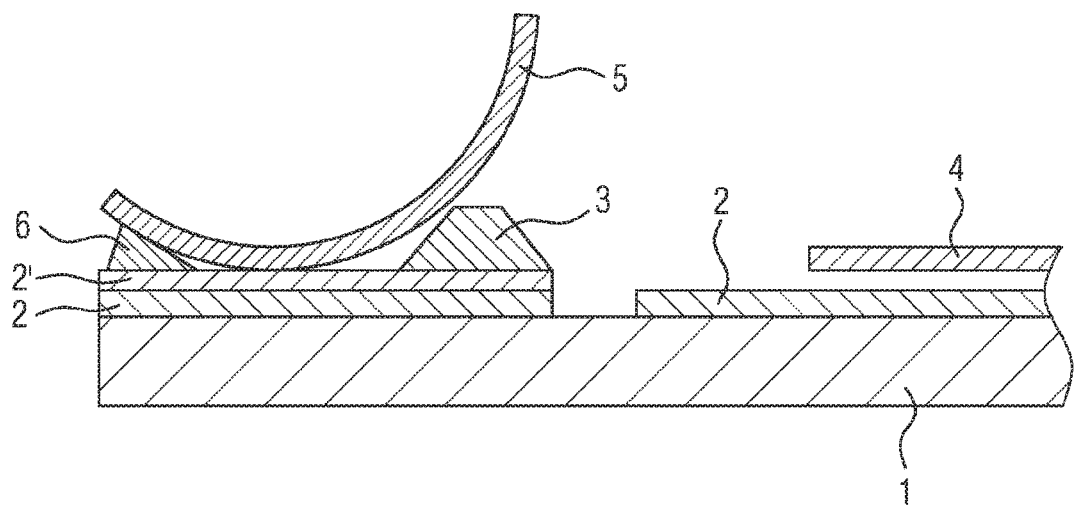
FIG. 4 is a schematic illustration of an arrangement made up of a printed circuit board and a cover or cover plate.

FIG. 3 and FIG. 4 illustrate a particularly simple and at the same time effective embodiment of a substrate-reinforcing step, which has the shape of a substantially positively stepped substrate reinforcement with at least one step or flank. In principle, however, other steps with both positive or substrate-reinforcing portions and negative or substrate-weakening portions are also conceivable in order to prevent the undesired wetting, mentioned at the beginning, of other faces, not intended to be wetted, of the populated substrate side.

FIG. 4 illustrates a multilayer structure of a sintering paste printed on in a stepped manner along the edges of the substrate 1. This sintering paste in this case comprises a first layer 2, a second layer 2', or reinforcing layer, and a third layer 3, wherein the first and second layer 2, 2' form the contact face portion, onto which the third layer 3 is printed in order to act as a barrier.

The thickness of the first layer 2 corresponds in this case to the layer thickness of the indicated conductor track 2, over which an indicated contact spring element 4 extends. The stepped sintering paste portion 2, 2', 3 and the conductor track 2 in this case consist expediently of the same material, for example of the abovementioned silver-containing sintering paste.

An alumina sintered ceramic printed in this way, which is already fully sintered before the sintering pastes 2, 2', 3 are printed on, finally passes through a sintering furnace, in which the sintering pastes 2, 2', 3 are dried and sintered. In the process, the sintering pastes 2, 2', 3 are compacted and solidified to form a physically solid structure and in the process form a cohesive bond with the alumina sintered ceramic.

Such a substrate or carrier material is suitable for a high-temperature or sintering process using what is referred to as LTCC (Low Temperature Cofired Ceramics) or HTCC (High Temperature Cofired Ceramics) technology, i.e. for a treatment at about 950° C. or even at about 1500° C.

An indicated cover 5 is cohesively bonded to the contact face 2' by means of a solder 6. The cover 5 does not in this case bear on the barrier 3, even if it easily could. The solder 6 is in this case applied to the substrate edge and accordingly spaced apart from the barrier 3. In principle, however, the solder can also bear on the barrier.

A barrier according to FIG. 3 or FIG. 4 effectively prevents the wetting of the conductor track 2 and thus also the wetting of the contact spring element 4 with the flux. This stops the contact spring element 4 from adhering to the conductor tract 2 as a result of such wetting.

Although exemplary embodiments have been discussed in the above description, it should be noted that numerous modifications are possible. Furthermore, it should be noted that the exemplary embodiments are merely examples which are not intended to limit the scope of protection, applications and structure in any way. Rather, the above description will provide a person skilled in the art with a guideline for implementing at least one exemplary embodiment, wherein various modifications, in particular with regard to the function and arrangement of the described constituent parts, may be made without departing from the scope of protection as defined by the claims and by these equivalent combinations of features.

The invention claimed is:

1. A printed circuit board comprising:
   a cover;
   a planar substrate bonded by a cohesive bond made by soldering at a contact face on a planar surface of the planar substrate to the cover;
   conductor tracks formed on the surface side of the planar substrate, the conductor tracks arranged inboard of and protected by the cover;
   an auxiliary material comprising flux configured to promote the cohesive bond; and
   a step, configured as a positive step, arranged on the planar surface of the planar substrate that extends away from the planar surface of the planar substrate and configured to form a barrier with respect to the auxiliary material for promoting the cohesive bond to prevent any wetting of the conductor tracks with the auxiliary material,
   wherein the cover does not bear on the barrier.

2. The printed circuit board as claimed in claim 1, wherein, the step arranged on the planar substrate is arranged on an inside with respect to the contact face of the planar substrate.

3. The printed circuit board as claimed in claim 1, wherein the step is formed in a substrate-reinforcing manner.

4. The printed circuit board as claimed in claim 1, wherein the step comprises the contact face.

5. The printed circuit board as claimed in claim 1, wherein the step is formed at least in one layer.

6. The printed circuit board as claimed in claim 5, wherein the step comprises:
   a first layer;
   a second layer; and
   a third layer that forms the barrier.

7. The printed circuit board as claimed in claim 1, wherein the step is formed in a manner encircling the conductor tracks.

8. The printed circuit board as claimed in claim 7, wherein the step is formed in a continuously encircling manner.

9. The printed circuit board as claimed in claim 1, wherein the step is formed along edges of the planar substrate.

10. The printed circuit board as claimed in claim 1, wherein the planar substrate is formed from a sintered ceramic.

11. The printed circuit board as claimed in claim 1, configured as a sensor.

12. The printed circuit board as claimed in claim 11, wherein the sensor is a fuel filling level measurement system.

13. The printed circuit board as claimed in claim 12, wherein the fuel filling level measurement system is arranged in a vehicle.

14. The printed circuit board as claimed in claim 1, wherein the step is radially inside a mounting portion of the cover.

15. A printed circuit board comprising:
   a cover;
   a planar substrate bonded by a cohesive bond at a contact face to the cover;
   conductor tracks formed on one side of the planar substrate, the conductor tracks protected by the cover;
   an auxiliary material for promoting the cohesive bond; and
   a step, configured as a positive step, arranged on the planar substrate that extends away from a planar surface of the planar substrate and configured to form a barrier with respect to the auxiliary material for promoting the cohesive bond to prevent any wetting of the conductor tracks with the auxiliary material,
   wherein the step contains metal.

16. The printed circuit board as claimed in claim 15, wherein the step is formed from a silver-containing sintering paste.

17. A printed circuit board, comprising:
   a cover;
   a planar substrate bonded by a cohesive bond at a contact face to the cover;
   conductor tracks formed on one side of the planar substrate, the conductor tracks protected by the cover;
   an auxiliary material for promoting the cohesive bond;

a step, configured as a positive step, arranged on the planar substrate radially inside a mounting portion of the cover, which extends away from a planar surface of the planar substrate and configured to form a barrier with respect to the auxiliary material for promoting the cohesive bond to prevent any wetting of the conductor tracks with the auxiliary material; and a solder seal that is at least partially radially outside the mounting portion of the cover.

18. The printed circuit board as claimed in claim 17, wherein the solder seal is spaced apart from the barrier.

19. A printed circuit board, comprising:
a cover;
a planar substrate bonded by a cohesive bond made by soldering at a contact face on a planar surface of the planar substrate to the cover;
conductor tracks formed on the surface side of the planar substrate, the conductor tracks arranged inboard of and protected by the cover;

an auxiliary material comprising flux configured to promote the cohesive bond;

a step, configured as a positive step, arranged on the planar surface of the planar substrate that extends away from the planar surface of the planar substrate and configured to form a barrier with respect to the auxiliary material for promoting the cohesive bond to prevent any wetting of the conductor tracks with the auxiliary material; and a perimeter conductor track arranged at an edge of the planar surface the planar substrate at which the cover is located, wherein a portion of the cover that contacts the perimeter conductor track is convex.

20. The printed circuit board as claimed in claim 19, wherein a material for the cohesive bond is a solder that is arranged on the substrate radially beyond a midpoint of the convex portion of the cover.

\* \* \* \* \*